(12) United States Patent
Udagawa

(10) Patent No.: US 7,034,330 B2
(45) Date of Patent: Apr. 25, 2006

(54) GROUP-III NITRIDE SEMICONDUCTOR DEVICE, PRODUCTION METHOD THEREOF AND LIGHT-EMITTING DIODE

(75) Inventor: Takashi Udagawa, Saitama (JP)

(73) Assignee: Showa Denko Kabushiki Kaisha, Tokyo (JP)

(\*) Notice: Subject to any disclaimer, the term of this patent is extended or adjusted under 35 U.S.C. 154(b) by 63 days.

(21) Appl. No.: 10/689,024

(22) Filed: Oct. 21, 2003

(65) Prior Publication Data

US 2004/0079959 A1   Apr. 29, 2004

Related U.S. Application Data

(60) Provisional application No. 60/422,121, filed on Oct. 30, 2002.

(30) Foreign Application Priority Data

Oct. 22, 2002 (JP) .................. P2002-306722

(51) Int. Cl.
*H01L 33/00* (2006.01)
*H01L 21/00* (2006.01)

(52) U.S. Cl. ............... 257/16; 257/22; 257/103; 257/190; 438/46; 438/47

(58) Field of Classification Search ........... 257/103, 257/190, 16, 22, 99, 189, 94, 96; 438/22, 438/47, 520, 46
See application file for complete search history.

(56) References Cited

U.S. PATENT DOCUMENTS

| | | | | |
|---|---|---|---|---|
| 5,076,860 A | * | 12/1991 | Ohba et al. ............... 148/33.1 |
| 6,069,021 A | | 5/2000 | Terashima et al. | |
| 6,541,799 B1 | * | 4/2003 | Udagawa .................. 257/94 |
| 6,787,814 B1 | * | 9/2004 | Udagawa .................. 257/101 |
| 6,828,169 B1 | * | 12/2004 | Terashima et al. ............ 438/22 |
| 2002/0000563 A1 | * | 1/2002 | Udagawa .................. 257/94 |

FOREIGN PATENT DOCUMENTS

JP    55-3834    1/1980

(Continued)

OTHER PUBLICATIONS

Isamu Akasaki (compiler), "Advanced Electronics Series, I-21, Group-III Nitride Semiconductor", 1st edition, pp. 288-289, Baifukan (Dec. 8, 1999).

(Continued)

*Primary Examiner*—Minh-Loan Tran
(74) *Attorney, Agent, or Firm*—Sughrue Mion, PLLC

(57) ABSTRACT

A Group-III nitride semiconductor device including a crystal substrate, an electrically conducting Group-III nitride semiconductor ($Al_XGa_YIn_{1-(X+Y)}N$: $0 \leq X < 1$, $0 < Y \leq 1$ and $0 < X+Y \leq 1$) crystal layer vapor-phase grown on the crystal substrate, an ohmic electrode and an electrically conducting boron phosphide crystal layer provided between the ohmic electrode and the Group-III nitride semiconductor crystal layer, the ohmic electrode being disposed in contact with the boron phosphide crystal layer. Also disclosed is a method for producing the Group-III nitride semiconductor device, and a light-emitting diode including the Group-III nitride semiconductor device.

11 Claims, 4 Drawing Sheets

FOREIGN PATENT DOCUMENTS

JP 10-56202 2/1998
JP 10-107315 4/1998

OTHER PUBLICATIONS

Isamu Akasaki et al.; "Effects of AlN Buffer Layer on Crystallographic Structure and on Electrical and Optical Properties of GaN and $Ga_{1-x}Al_xN$ ($0<x\leq0.4$) Films Grown on Sapphire Substrate by MOVPE"; Journal of Crystal Growth (the Netherlands); vol. 98, pp. 209-219 (1989).

Isamu Akasaki (compiler); "Advanced Electronics Series, I-21, Group-III Nitride Semiconductor"; 1st edition, pp. 211-213, Baifukan (Dec. 8, 1999).

* cited by examiner

US 7,034,330 B2

GROUP-III NITRIDE SEMICONDUCTOR DEVICE, PRODUCTION METHOD THEREOF AND LIGHT-EMITTING DIODE

CROSS-REFERENCE TO RELATED APPLICATIONS

This application claims benefit of Provisional Application 60/422,121 filed Oct. 30, 2002, incorporated herein by reference, under 35 U.S.C. § 111(b) pursuant to 35 U.S.C. § 119 (e) (1).

BACKGROUND OF THE INVENTION

1. Field of the Invention

The present invention relates to a Group-III nitride semiconductor device comprising a crystal substrate having thereon a Group-III nitride semiconductor ($Al_XGa_YIn_{1-(X+Y)}N$: $0 \leq X<1$, $0<Y \leq 1$ and $0<X+Y \leq 1$) crysta layer, and an ohmic electrode having a low contact resistance provided thereon via a low dislocation density boron phosphide crystal layer.

2. Related Art

Known examples of a Group-III nitride semiconductor device include a gallium nitride (GaN)-based light emitting diode (LED) or laser diode (LD) and a Schottky contact-type field-effect transistor (MESFET) (see, for example, Patent Document 1). These devices have a stacked structure comprising a functional layer composed of aluminum gallium indiumnitride ($Al_aGa_bIn_cN$: $0 \leq a,b,c \leq 1$, a+b+c=1) mixed crystal or the like (see, for example, Patent Document 2). For example, a gallium indium nitride mixed crystal ($Ga_bIn_cN$: $0<b,c<1$, b+c=1) containing GaN having a band gap of about 3.4 eV at room temperature is used as a light-emitting layer in short-wavelength LED or LD denies (see, for example, Patent Document 3). The device is fabricated by providing an ohmic electrode in ohmic contact with a part of the functional layer constituting the stacked structure. For example, titanium (Ti) and aluminum (Al) may be stacked on the surface of an n-type gallium nitride (GaN) electron supply layer to provide ohmic source and drain electrodes, to thereby fabricate a high mobility field-effect transistor (see, for example, Non-Patent Document 1).

Furthermore, the $Al_aGa_bIn_cN$ ($0 \leq a,b,c \leq 1$, a+b+c=1) mixed crystal constituting the Group-III nitride semiconductor device is conventionally deposited on sapphire ($\alpha$–$Al_2O_3$) as a substrate (see, for example, Patent Document 4). However, a large lattice mismatching is present between the sapphire and the $Al_aGa_bIn_cN$ ($0 \leq a,b,c \leq 1$, a+b+c=1) mixed crystal or the like. For example, the degree of the lattice mismatching between the sapphire and Wurtzite crystal structure GaN is as large as about 16% (see, Non-Patent Document 2). Therefore, for example, the inside of a gallium nitride layer grown on the sapphire substrate contains a large amount of dislocations in the order of about $1 \times 10^5/cm^2$ due to the large lattice mismatching therebetween (see, Non-Patent Document 3).

Patent Document 1
 U.S. Pat. No. 6,069,021, specification

Patent Document 2
 JP-A-10-56202 (the term "JP-A" as used herein means an "unexamined published Japanese patent application")

Patent Document 3
 JP-B-55-3834 (the term "JP-B" as used herein means an "examined Japanese patent publication")

Patent Document 4
 JP-A-10-107315

Non-Patent Document 1
 Isamu Akasaki (compiler), *Advanced Electronics Series, I-21, Group-III Nitride Semiconductor*, 1st edition, pp. 288–289, Baifukan (Dec. 8, 1999)

Non-Patent Document 2
 Isamu Akasaki, Hiroshi AMANO, Yasuo KOIDE, Kazumasa HIRAMATSU and Nobuhiko SAWAKI, "Effects of AlN Buffer Layer on Crystallographic Structure and on Electrical and Optical Properties of GaN and Ga1-XAlXN ($0<X \leq 0.4$) Films Grown on Sapphire Substrate by MOVPE", *Journal of Crystal Growth* (the Netherlands), Vol. 98, pp. 209–219 (1989).

Non-Patent Document 3
 Isamu Akasaki (compiler), *Advanced Electronics Series, I-21, Group-III Nitride Semiconductor*, 1st edition, pp. 211–213, Baifukan (Dec. 8, 1999)

However, the band gap, for example, of hexagonal Wurtzite crystal structure GaN is as high as about 3.4 eV at room temperature and the Group-III nitride semiconductor ($Al_aGa_bIn_cN$: $0 \leq a,b,c \leq 1$, a+b+c=1) mixed crystal layer on which an ohmic contact electrode is generally provided has a high band gap.

Because of this, an ohmic electrode having sufficiently low contact resistance can hardly be obtained. Furthermore, the $Al_aGa_bIn_cN$ crystal layer grown on a sapphire substrate has a problem in that device operating current can leak through dislocation present with a high density in the crystal. As a result, an ohmic electrode having excellent breakdown voltage cannot be formed.

SUMMARY OF THE INVENTION

The present invention has been achieved by taking into account the above-described problems of the prior art, and an object of the present invention is to provide a Group-III nitride semiconductor device comprising an ohmic electrode having a low contact resistance and free from local breakdown.

As a result of extensive investigations to solve these problems, the present inventors have found that the above-described object is attained by providing a boron phosphide crystal layer having a low dislocation density and excellent crystallinity on a Group-III nitride semiconductor crystal layer, and disposing an ohmic electrode in contact with the surface of the boron phosphide crystal layer. The present invention has been accomplished based on this finding.

More specifically, the present invention provides (1) a Group-III nitride semiconductor device comprising a crystal substrate, an electrically conducting Group-III nitride semiconductor ($Al_XGa_YIn_{1-(X+Y)}N$: $0 \leq X<1$, $0<Y \leq 1$ and $0<X+Y \leq 1$) crystal layer vapor-phase grown on the crystal substrate, and an ohmic electrode, wherein an electrically conducting boron phosphide crystal layer is provided between the ohmic electrode and the Group-III nitride semiconductor crystal layer, and the ohmic electrode is disposed in contact with the boron phosphide crystal layer; (2) the Group-III nitride semiconductor device as described in (1) above, wherein a non-crystalline layer containing boron and phosphorus is provided between the Group-III nitride semiconductor crystal layer and the boron phosphide crystal layer; (3) the Group-III nitride semiconductor device as described in (1) or (2) above, wherein the boron phosphide crystal layer is constituted by an undoped electrically conducting layer not having intentionally added thereto an impurity and having the same conduction type as the group-III nitride semiconductor; (4) the Group-III nitride semiconductor device as described in any one of (1) to (3) above, wherein the boron phosphide crystal layer is provided on the {0.0.0.1.}-surface of the Group-III nitride semiconductor crystal layer and the boron phosphide crystal layer is an electrically conducting {111}-oriented layer; (5) the Group-III nitride semiconductor device as described in any one of (1) to (4) above, wherein the inside of the boron phosphide crystal layer containing a stacking fault or a twin with the twin (boundary) being a {111}-plane along the <111>-crystal azimuth of the boron phosphide crystal layer; (6) the Group-III nitride semiconductor device as described in any one of (1) to (5) above, wherein the total density of threading dislocations and misfit dislocations inside the boron phosphide crystal layer is $1 \times 10^4/cm^2$ or less; (7) a method for producing the Group-III nitride semiconductor device described in (1) to (6) above, which comprises forming the Group-III nitride semiconductor crystal layer and the boron phosphide crystal layer on the crystal substrate by a metal-organic chemical vapor deposition process; and (8) a light-emitting diode comprising the Group-III nitride semiconductor device described in (1) to (6) above, and which has a pn-junction type double heterojunction structure.

DETAILED DESCRIPTION OF THE INVENTION

The present invention is described in further detail below by reference to the drawings. However, the present invention should not be construed as being limited thereto.

Figure 1:
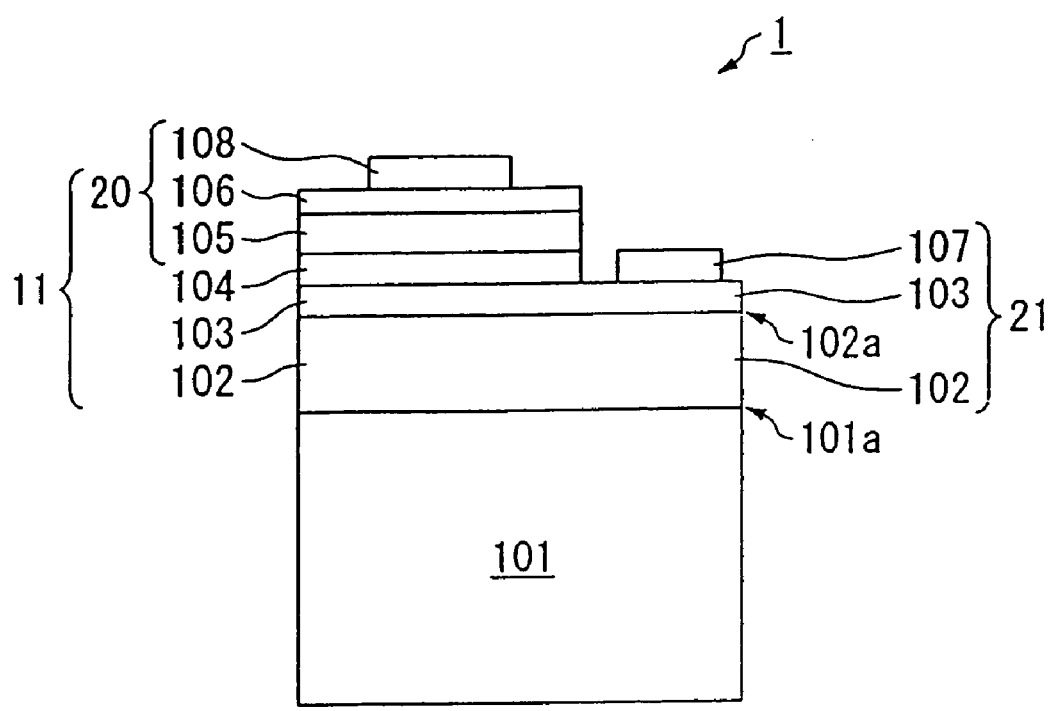
FIG. 1 is a cross-sectional view showing a first embodiment of the Group-III nitride semiconductor device of the present invention.

FIG. 1 is a cross-sectional view showing a first embodiment of the Group-III nitride semiconductor device according to the present invention.

As shown in FIG. 1, the Group-III nitride semiconductor device 1 of this practical embodiment is fabricated by stacking a stacked structure 11 on a substrate 101. For the substrate 101, a sapphire crystal with the surface having a {0.0.0.1} surface is used. The stacked structure 11 comprises a lower clad layer 102 composed of n-type GaN, an n-type boron phosphide layer 103, a light-emitting layer 104 composed of n-type $Ga_{0.9}In_{0.10}N$, an upper clad layer 105 composed of p-type GaN layer, and a p-type boron phosphide layer 106, which are stacked in this order. Each of the light-emitting layer 104, the upper clad layer 105 and the p-type boron phosphide layer 106 is partially removed and on a part of the surface of the exposed n-type boron phosphide layer 103, an n-type ohmic electrode 107 is provided in contact with layer 103. Furthermore, on the surface of the p-type boron phosphide layer 106, a p-type ohmic electrode 108 is provided in contact with layer 106.

As such, the Group-III nitride semiconductor device 1 comprises an n-type lower layer part 21 consisting of a lower clad layer 102, an n-type boron phosphide layer 103 and an n-type ohmic layer 107, and a p-type upper layer part 20 consisting of a light-emitting layer 104, an upper clad layer 105, a p-type boron phosphide layer 106 and a p-type ohmic electrode 108.

The Group-III nitride semiconductor device 1 having such a constitution is a pn-junction type double hetero (DH) structure LED.

The Group-III nitride semiconductor device 1 of this first embodiment is advantageous particularly in the case of using a single crystal having a large lattice mismatching with a Group-III nitride semiconductor, as the substrate 101, to grow thereon a Group-III nitride semiconductor crystal layer as the lower clad layer 102. Accordingly, this embodiment is particularly effective when a conventionally employed an oxide single crystal, gallium arsenide (GaAs), gallium phosphide, cubic or hexagonal silicon carbide (SiC), silicon (Si) single crystal (silicon) or the like is used as the substrate on which a Group-III nitride semiconductor crystal layer is formed. The temperature suitable for the growth of a Group-III nitride semiconductor crystal layer is generally high and therefore, SiC, $\alpha-Al_2O_3$ and Si crystals and the like having excellent heat resistance are preferred as the substrate.

Also, for example, a cubic zinc-blende structure single crystal having a {100}- or {110}-surface is preferably used as the substrate 101. When such a substrate is used, a Group-III nitride semiconductor crystal layer having a {0.0.0.1} or {1.1.–2.0.} surface can be deposited on the substrate. The Group-III nitride semiconductor layer having a {0.0.0.1.} or {1.1.–2.0.} surface can be suitably used for depositing a boron phosphide layer which is described below.

Furthermore, a characteristic feature of the Group-III nitride semiconductor device 1 is that boron phosphide layers 103 and 106 are provided in contact with the n-type and p-type Group-III nitride semiconductor layers 102 and 105, respectively. The boron phosphide layers 103 and 106 each functions as an electrically conducting layer on which art ohmic electrode 107 or 108 having particularly low contact resistance is provided. For forming the n-type or p-type ohmic electrode having low contact resistance, the semiconductor layer on which the electrode is provided is preferably a low-resistance crystal layer having a carrier concentration of $1 \times 10^{18}$ cm$^{-3}$ or more, more preferably $1 \times 10^{19}$ cm$^{-3}$ or more, and also is preferably a crystal layer having a low dislocation density and capable of inhibiting the propagation of dislocations originating from the substrate or Group-III nitride layer. When a covalent semiconductor crystal having almost no ionic bonding property, such as boron phosphide (BP) and boron arsenide (BAs), is used, an n-type or p-type low-resistance electrically conductive layer having a high carrier concentration can be formed. Moreover, in these compound semiconductors, semiconducting layers having a high carrier concentration can form even under an undoped state in which an impurity is not intentionally added.

Particularly, the crystal layer 106, on which an ohmic electrode 108 is provided in the direction of picking up emission from the light-emitting layer 104 for penetrating light emitted from the light-emitting layer to the outside (in the Group-III nitride semiconductor device 1 shown in FIG. 1, i.e., in the direction from the light-emitting layer 104 to the upper clad layer 105), is optimally constituted with a crystal layer having a large band gap which does not absorb but fully transmits the emitted light, namely, a boron phosphide crystal layer. Furthermore, in the case of an LED, a suitable material for transmitting the emitted light to the outside is a boron phosphide layer having a large band gap.

The Group-III nitride semiconductor device 1 can be produced as follows. First, a Group-III nitride semi-conductor layer such as gallium nitride (GaN) is deposited on the surface of a substrate 101 by means of metal-organic chemical vapor deposition (MOCVD) to form a lower clad layer 102. Other examples of the method for growing a Group-III nitride semiconductor layer on the substrate surface include a halogen CVD, a hydride CVD and a molecular beam epitaxial (MBE) method. Thereafter, an n-type boron phosphide (BP) layer 103, a light-emitting layer 104 composed of n-type $Ga_{0.90}In_{0.10}N$ lattice matched to the BP layer 103, an upper clad layer 105 composed of a p-type GaN layer, and a p-type boron phosphide layer 106 are sequentially formed by the same growth method. When the layers 102 to 106 are formed by the same growth method, a stacked structure can be simply, readily and labor-savingly formed. After completing formation of the stacked structure 11, the light-emitting layer 104, upper clad layer 105 and p-type boron phosphide layer 106 constituting the structure each is partially removed until the surface of the n-type boron phosphide layer 103 is exposed. On a partial region of the exposed n-type boron phosphide layer 103, an n-type ohmic electrode 107 is provided. Thereafter, a p-type ohmic electrode 108 is disposed in contact with the surface of the p-type boron phosphide layer 106 on the upper clad layer 105, thereby producing a Group-III nitride semiconductor device 1 which is a pn-junction type double hetero (DH) structure LED.

The boron phosphide layers 103 and 106 can be formed by the above-described vapor growth method, for example, by a normal-pressure (nearly atmospheric-pressure) or reduced-pressure MOCVD method using triethylborane (molecular formula: $(C_2H_5)_3B$)/phosphine (molecular formula: $PH_3$) as source materials. More specifically, according to the atmospheric-pressure MOCVD method, when the substrate temperature is set to about 1,000 to 1,200° C. and the concentration ratio ($PH_3/(C_2H_5)_3B$) of source materials supplied to the growth reaction system, i.e., V/III ratio, is set to, for example, about 1,000, an undoped p-type boron phosphide layer can be formed. When the substrate temperature is set to 750 to about 1,000° C., this is advantageous for obtaining an undoped n-type boron phosphide layer. Irrespective of the conduction type, the boron phosphide layer formed on a Group-III nitride semiconductor layer such as GaN has an effect of preventing misfit dislocation or dislocations present inside the Group-III nitride semiconductor layer such as GaN from propagating to the overlying layer.

The misfit dislocations present inside the Group-III nitride semiconductor layer can be observed, for example, on a cross-sectional TEM (transmission electron microscope) image of a portion including the substrate 101, lower clad layer 102 and boron phosphide layer 103. On the junction interface 101a between the substrate 101 and the GaN layer constituting the lower clad layer 102, a large amount of misfit location is generated due to the lattice mismatching with the sapphire substrate 101. As the thickness of the GaN layer increases, the number of misfit dislocations per unit area, i.e., dislocation density, decreases, but in the region beneath the junction interface 102a with the boron phosphide layer 103, the dislocation density is still as high as about $1\times10^5/cm^2$. However, dislocations are prevented from extending at the junction interface 102a with the boron phosphide layer 103 and the invasion or propagation of dislocations inside the boron phosphide layer 103 is not observed. That is, the boron phosphide layer hetero-joined to the Group-III nitride semiconductor layer inhibits the propagation of dislocations from the Group-III nitride semiconductor layer.

In general, the dislocation density is preferably about $1\times10^4/cm^2$ or less so as not to generate serious breakdown. According to the Group-III nitride semiconductor device 1 of this first embodiment, a boron phosphide layer having a low dislocation density of $1\times10^4/cm^2$ or less can be formed.

Also, a {111}-oriented boron phosphide layer is preferably provided as the boron phosphide crystal layer 103 and/or 106 contacting the {0.0.0.1}-surface of the Group-III nitride semiconductor crystal layer such as GaN used for the lower clad layer 102 and/or the upper clad layer 105.

The lattice constant of zinc-blende structure boron mono phosphide suitably for the formation of boron phosphide crystal layer is 0.458 nm and lattice spacing between its {110}-planes nearly agrees with the a-axis lattice constant (0.319 nm) of Wurtzite structure GaN. In addition, the lattice spacing between {111}-planes of boron phosphide crystal nearly agrees with the half value of c-axis lattice constant (0.529 nm) of Wurtzite structure GaN. Accordingly, the {111}-oriented boron phosphide layer formed on the {0.0.0.1.}-surface of GaN becomes a good crystal layer having reduced misfit dislocation ascribable to lattice mismatching.

Furthermore, a boron phosphide layer containing stacking faults along the <111>-crystal azimuth can be used as a good boron phosphide crystal layer having particularly reduced misfit dislocation. Also, a boron phosphide layer containing a {111}-twin with the twin boundary being a {111}-plane can be suitably used. The stacking fault or twin absorbs the misfit dislocation and therefore, dislocations are scarcely generated inside the boron phosphide layer. As a result, an ohmic electrode free of local breakdown can be formed. The boron phosphide layer containing stacking faults or twins is suitably grown at a rate (growth rate) of 10 nm/min or more by setting the substrate temperature to 750 to 1,200° C.

Although not shown in this first embodiment, an amorphous layer containing boron and phosphorus can be provided between the Group-III nitride semiconductor crystal layer and the boron phosphide crystal layer. By providing an amorphous layer containing boron and phosphorus, a boron phosphide layer having continuity can be obtained. The boron and phosphorus constituting amorphous layer provides a "growth nucleus" in the over growth of a boron phosphide crystal layer and contributes to the promotion of smooth growth of the boron phosphide crystal layer. At this time, the thickness of the amorphous layer is preferably from 2 to 50 nm. If the thickness exceeds 50 nm, formation of the boron phosphide crystal layer as a single crystal is disadvantageously inhibited. Whereas, the thickness is less than 2 nm, the amorphous layer cannot uniformly cover the entire surface of the Group-III nitride semiconductor layer. That is, the "growth nuclei" cannot be uniformly formed on the surface of the Group-III nitride semiconductor layer. A boron phosphide layer having a preferable continuous and flat surface therefore cannot be stably obtained. The amorphous layer containing boron and phosphorus can be obtained by means of the MOCVD method and by setting a low V/III ratio of 2 to 50 in the temperature range from 250 to 1,200° C. An X-ray or electron beam diffraction technique or the like to is available to confirm an amorphous feature of thus formed BP layer. Furthermore, the thickness of the layer can be exactly measured in practice, for example, by the cross-sectional TEM method.

The boron phosphide layer on which an ohmic electrode is provided is made to have the same conduction type as that of the Group-III nitride semiconductor layer joined to the boron phosphide layer. For example, an n-type-ohmic electrode is disposed in contact with an n-type boron phosphide layer which in turn is joined to an n-type Group-III nitride semiconductor layer.

A second embodiment of the invention is described below. In this second embodiment, the upper layer part 20 has the structure shown in FIG. 2. More specifically, a p-type ohmic electrode 108 is disposed on p-type Group-III nitride semiconductor layer 112 via an upper p-type boron phosphide layer 110 and an n-type boron phosphide layer 111, which layers 110 and 111 both contact the p-type Group-III nitride semiconductor layer 112.

This structure is advantageous in that the pn-junction formed between the n-type boron phosphide layer 111 and the p-type boron phosphide layer 110 inhibits a short pass of the device operating current from the p-type ohmic electrode 108 to the p-type Group-III nitride semiconductor layer 112 beneath the electrode 108. Also, the operating current can be diffused planar over a wide area of the p-type Group-III nitride semiconductor layer 112. The ohmic electrode 108 having a current blocking structure by virtue of such junction of p-type and n-type boron phosphide layers can be advantageously used for fabricating a Group-III nitride semiconductor LD. In order to realize the current blocking activity for the ohmic electrode having a low contact resistance, the thickness of each boron phosphide layer constructing the pn junction is preferably 50 nm or more. The layer thickness of each layer is also preferably 500 nm or less.

The conduction types of the boron phosphide layer 111, boron phosphide layer 110, ohmic electrode 108 and Group-III nitride semiconductor layer 112 may be reversed in this second embodiment. Furthermore, this structure may also be employed for an ohmic electrode 107 at the lower layer part 21 shown in FIG. 1.

EXAMPLES

The present invention is described below by reference to the following Examples. However, the present invention should not be construed as being limited thereto.

Example 1

Figure 2:
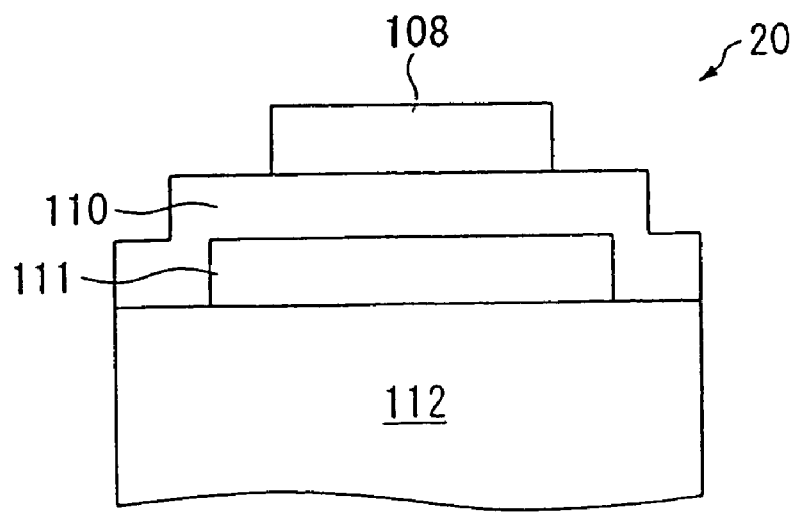
FIG. 2 is a cross-sectional view showing a second embodiment of the Group-III nitride semiconductor device of the present invention.
Figure 3:
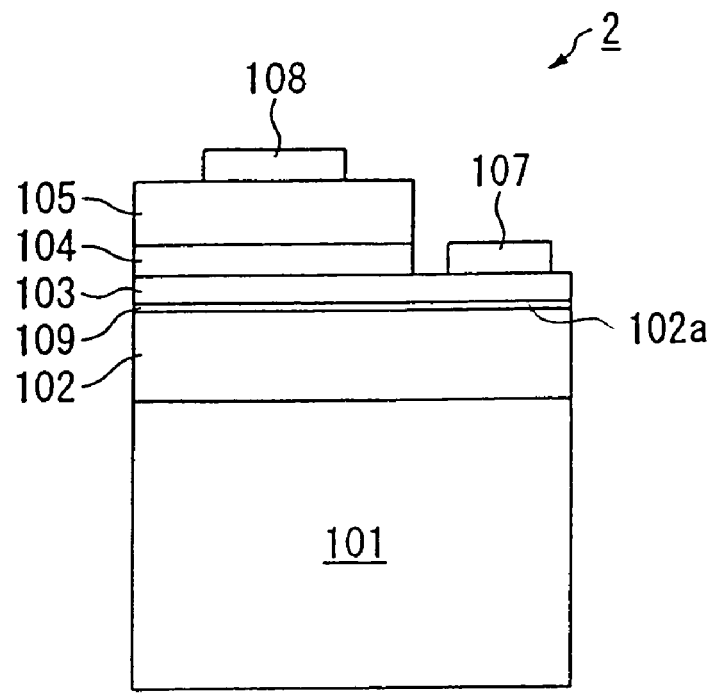
FIG. 3 is a cross-sectional schematic view of a light-emitting diode described in Example 1.

In this Example, an LED having hetero-junction of a gallium nitride (GaN) layer and a boron phosphide layer was prepared. FIG. 3 shows schematically a cross-sectional structure of LED 2 of this Example. In FIG. 3, the same constituent elements as in FIG. 1 or 2 are shown by the same reference numerals.

A sapphire having a (0.0.0.1.)-crystal face surface was used as the substrate 101. On the (0.0.0.1.) surface, a lower clad layer 102 constructed with an n-type GaN layer was deposited by an atmospheric-pressure MOCVD method using a trimethyl gallium $((CH_3)_3Ga)$/ammonia $(NH_3)$ source system. The gallium nitride (GaN) layer had a {0.0.0.1.}-crystal surface. The thickness of the lower clad layer 102 was $2.8 \times 10^4$ cm (=2.8 μm), and the carrier concentration of the layer 102 was $2 \times 10^{18}$ cm$^{-3}$.

An undoped amorphous layer 109 containing boron and phosphorus was deposited on the lower clad layer 102. The amorphous layer 109 was deposited at 1,025° C. by a atmospheric-pressure MOCVD method using a $(C_2H_5)_3B/PH_3/H_2$ system. The layer thickness was 12 nm. On the amorphous layer 109, a boron phosphide crystal layer 103 was deposited at 1,025° C. by an atmospheric-pressure MOCVD method using a $(C_2H_5)_3B/PH_3H_2$ system. The boron phosphide layer 103 was an undoped n-type layer having a carrier concentration of $2 \times 10^{19}$ cm$^{-3}$ and the thickness thereof was 150 nm.

On the boron phosphide layer 103, a light-emitting layer 104 composed of $Ga_{0.90}In_{0.10}N$ was grown at 850° C. by a atmospheric-pressure MOCVD method using a $(CH_3)_3Ga$/tri-methyl indium (molecular formula: $(CH_3)_3In$)/$NH_3/H_2$ system. The layer thickness was 50 nm and the carrier concentration was about $3 \times 10^{18}$ cm$^{-3}$. On the light-emitting layer 104, an upper clad layer 105 composed of p-type GaN was grown by the $(CH_3)_3Ga/NH_3/H_2$ atmospheric-pressure MOCVD method. The thickness of the upper clad layer 105 was 150 nm. The carrier concentration of the GaN layer constituting the upper clad layer 105 was about $6 \times 10^{17}$ cm$^{-3}$.

After completing growth of the upper clad layer 105, the internal crystallographic structure of the lower clad layer 102, amorphous layer 109, boron phosphide layer 103 and light-emitting layer 104 constituting the stacked structure were examined by a cross-sectional TEM technique. According to the selected-area electron diffraction analysis, the lower clad layer 102 (GaN layer) provided on the (0.0.0.1.)-sapphire surface of the substrate 101 was a {0.0.0.1.}-oriented layer, and the boron phosphide layer 103 on the lower clad layer 102 (GaN layer) was a {111}-oriented layer. A high resolution bright field contrast transmission electron microscopic image revealed that misfit dislocations were present in a large amount of about $5 \times 10^{11}$/cm$^2$ in the lower clad layer 102 near the junction interface 101a (FIG. 1) with the sapphire substrate 101. The dislocation density decreased to about $5 \times 10^9$/cm$^2$ in the region of the lower clad layer 102 near the junction interface 102a with the amorphous layer 109. At the junction interface 102a with the amorphous layer 109, dislocations from the lower clad layer 102 were inhibited from intruding inside the amorphous layer 109 and the boron phosphide layer 103. Therefore, misfit dislocation was scarcely observed in the boron phosphide layer 103. On the other hand, a stacking fault or a twin extending along the {111}-crystal azimuth was present inside the boron phosphide layer 103. The stacking fault or the twin was generated from the junction interface 102a with the lower clad layer 102. It is considered that the dislocations are absorbed by the stacking fault or the twin, and dislocations were therefore scarcely present inside the boron phosphide layer 103.

The stacking fault or the twin of the boron phosphide layer 103 partially intruded into the overlying $Ga_{0.90}In_{0.10}N$ light-emitting layer 104. However, by virtue of well matching between the lattice spacings of the {110}-crystal plane intersecting with the surface of the {111}-boron phosphide layer 103 and the a-axis lattice constant of $Ga_{0.90}In_{0.10}N$ constituting the light-emitting layer 104, dislocations were scarcely observed inside the light-emitting layer 104.

Subsequently, partial regions of the GaN layer constituting the upper clad layer 105 and the light-emitting layer 104 were removed by means of selective patterning and plasma etching techniques, and thereby, the surface of the n-type boron phosphide layer 103 was exposed. On the exposed surface of the n-type boron phosphide layer 103, an n-type ohmic electrode 107 composed of a gold-germanium alloy (Au: 95 wt %·Ge 5 wt %) was disposed. The contact resistance of the Au·Ge ohmic electrode 107 was about 6×10⁻⁶ Ω/cm². Meanwhile, when the Au·Ge ohmic electrode was provided in direct contact with an n-type GaN layer having the same carrier concentration, the contact resistance was about 10⁻³ Ω/cm². On the surface of the remaining upper clad layer 105, a p-type ohmic electrode 108 having a nickel oxide (NiO)/gold (Au) stacked structure was provided to fabricate a pn-junction DH structure LED 2.

An operating current of 20 mA was passed in the forward direction between the n-type and p-type ohmic electrodes 107 and 108 to evaluate the emission properties of the LED chip 2 cut into a square with a one-side length of about 3.5×10⁻² cm. The resulting emission properties are shown below.

(1) Emission color: blue violet
(2) Emission center wavelength: about 430 (nm)
(3) Brightness (chip state): about 7 (mcd)
(4) Forward voltage: about 3.8 (V) (provided that the forward current was 20 mA)
(5) Reverse voltage: 12 V (provided that the reverse current was 10 μA)

The n-type ohmic electrode 107 was provided in contact with the boron phosphide layer 103 having a low dislocation density. Therefore, short-circuit flow of the operating current to the underlying GaN layer could be prevented, and the operating current could be diffused over a wide area of the lower clad layer 102. As a result, it was confirmed from the near field emission image that light was emitted from almost the entire surface of the light-emitting layer 104 in LED 2.

Example 2

In this Example, an LED in which both n-type and p-type ohmic electrodes were disposed on a boron phosphide layer was produced.

Figure 4:
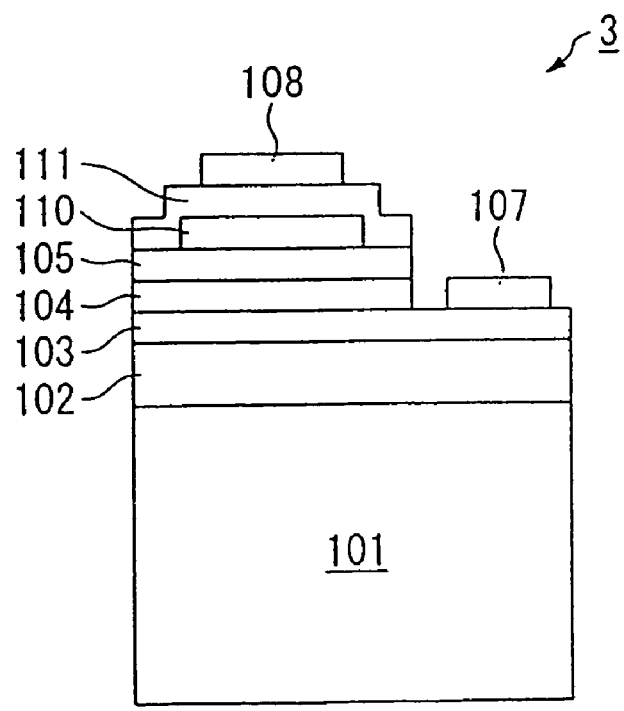
FIG. 4 is a cross-sectional schematic view of a light-emitting diode described in Example 2.
Figure 5:
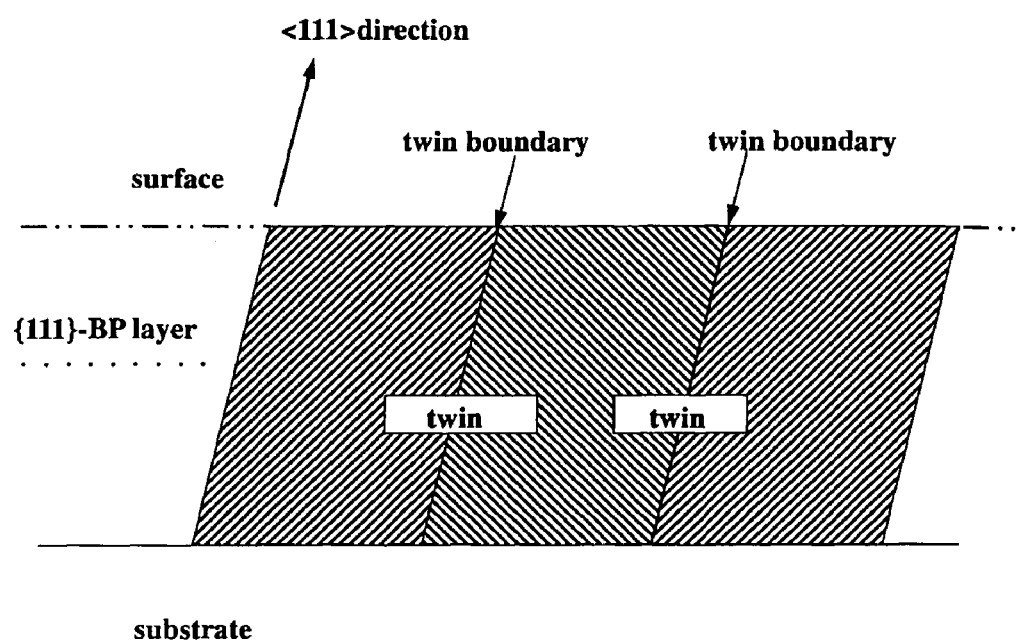
FIG. 5 is an illustration of a boron phosphide crystal layer containing stacking faults and twins with twin boundaries.
Figure 6:
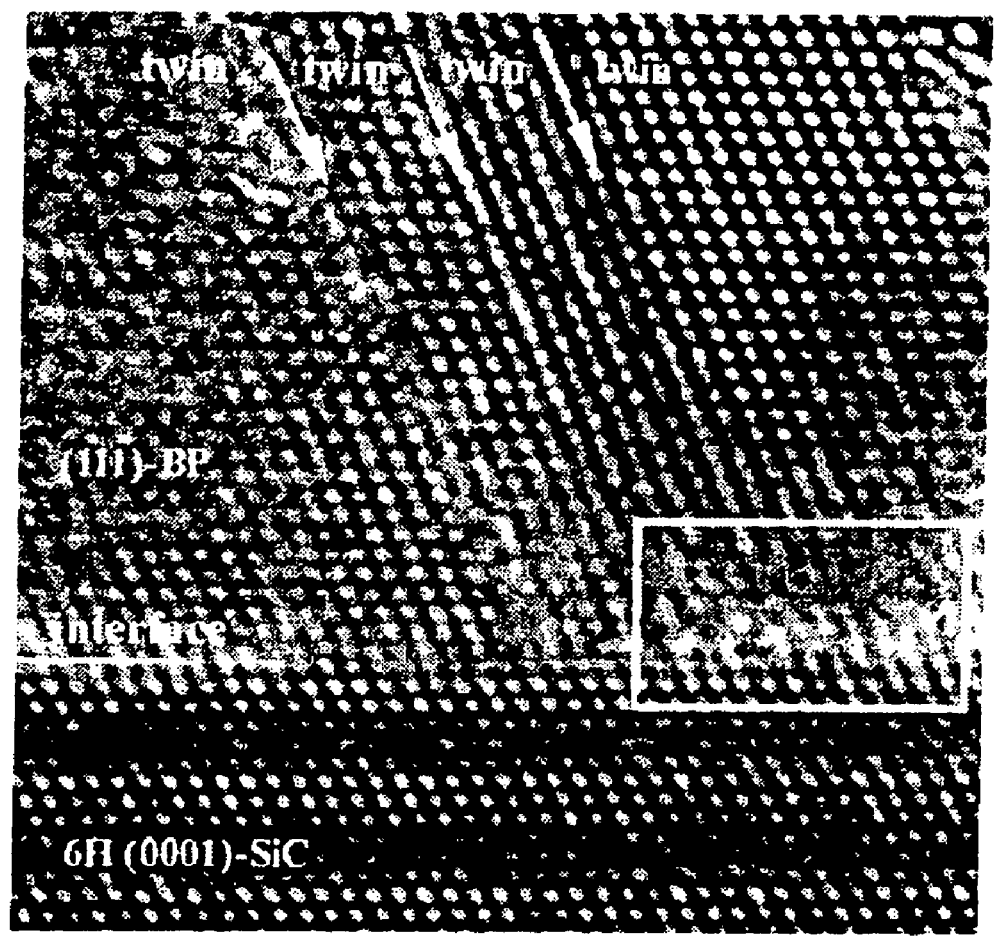
FIG. 6 is a microphotograph showing stacking faults and twins in a BP layer grown on a SiC support.

FIG. 4 schematically shows a cross-sectional structure view of LED 3 of this Example. The same constituent elements as those in any of FIGS. 1 to 3 are shown by the same reference numerals.

Under the same conditions as in Example 1, layers 102 to 105 described in Example 1 were sequentially deposited on a (0.0.0.1.)-crystal surface of sapphire substrate 101. Thereafter, an undoped n-type boron phosphide layer 110 was deposited on the p-type upper clad layer 105. The n-type boron phosphide layer 110 was deposited at 850° C. by an atmospheric-pressure MOCVD method using a $(C_2H_5)_3B/PH_3/H_2$ system. The carrier concentration was 1×10¹⁹ cm⁻³ and the layer thickness was 120 nm. After completing growth of the n-type boron phosphide layer 110, only the circular region of the n-type boron phosphide layer 110 underlying beneath the subsequently formed p-type ohmic electrode 108 was left to remain. The planar area of the remaining n-type boron phosphide layer 110 was 1.2 times larger than bottom area of the circular p-type ohmic electrode 108. The n-type boron phosphide layer 110 disposed outside the vertically projected region of the p-type ohmic electrode was removed by plasma etching to expose the surface of the underlying p-type upper clad layer 105.

Thereafter, an undoped p-type boron phosphide layer 111 was deposited to cover the remaining n-type boron phosphide layer 110 and the exposed surface of the p-type upper clad layer 105. The p-type boron phosphide layer 111 was also grown at 1,025° C. by the same MOCVD method as shown above. The carrier concentration of the p-type boron phosphide layer was 2×10¹⁹ cm⁻³ and the thickness was 200 nm.

Subsequently, the p-type boron phosphide layer 111, the upper clad layer 105 and the light-emitting layer 104 presented at a region for later forming an n-type ohmic electrode 107 were removed by selective patterning and plasma etching technique. After the removal of the layers 111, 105 and 104, an n-type ohmic electrode 107 composed of an Au.Ge alloy was formed on the exposed surface of the n-type boron phosphide layer 103. At the upper side of the remaining n-type boron phosphide layer 110, a circular p-type ohmic electrode 108 composed of gold.beryllium alloy (Au 99 wt %·Be 1 wt %) and having a diameter of 1.3×10⁻² cm (=130 μm) was formed in contact with the surface of the p-type boron phosphide layer 111. The circular p-type ohmic electrode 108 was provided by aligning the center thereof with the center of the remaining n-type boron phosphide layer 110. In this way, a pn-junction DH structure LED 3 was fabricated. The contact resistance of the p-type ohmic electrode 108 was 5×10⁻⁶ Ω/cm².

According to observation by means of electron diffraction and cross-sectional TEM techniques, misfit dislocations were scarcely observed inside the n-type boron phosphide layer 110 joined to the surface of the p-type GaN layer constituting the upper clad layer 105 and inside the p-type boron phosphide layer 111 joined to the n-type boron phosphide layer 110. The dislocation density of the boron phosphide layers 110 and 111 was found to be 1×10⁴/cm² or less. On the other hand, a stacking fault or a twin was present in parallel to the <111>-crystal direction of boron phosphide layers 110 and 111. Accordingly, the n-type and p-type ohmic electrodes 107 and 108 were formed on the boron phosphide layers 103 and 111 having greatly reduced misfit dislocations.

An operating current of 20 mA was passed in the forward direction between the n-type and the p-type ohmic electrodes 107 and 108 to evaluate the emission properties of the LED chip 3 in a square form with a one-side length of about 4.0×10⁻² cm. The resulting emission properties are shown below.

(1) Emission color: blue violet
(2) Emission center wavelength: about 440 (nm)
(3) Brightness (chip state): about 9 (mcd)
(4) Forward voltage: about 3.6 (V) (provided that the forward current was 20 mA)
(5) Reverse voltage: 15 V (provided that the reverse current was 10 μA)

Both the n-type and the p-type ohmic electrodes 107 and 108 were provided in contact with the boron phosphide layers 103 and 111 having a low dislocation density, respectively. Therefore, LED 3 could exhibit a particularly excellent breakdown voltage property without generation even local breakdown. Furthermore, the pn-junction structure composed of the n-type and the p-type boron phosphide layers 110 and 111 was embedded under the p-type ohmic electrode 108. Therefore, short-circuit current flow from the p-type ohmic electrode 108 to the upper clad layer 105 underlying the electrode could be avoided, and the operating current could be diffused almost over the entire surface of the upper clad layer 105 through the p-type boron phosphide layer 111 provided almost over the entire surface of the p-type clad layer 105. As a result, light could be emitted from almost the entire surface of the light-emitting layer 104 of LED 3. In addition, the boron phosphide layer 111 on which the p-type ohmic electrode 108 was provided had a band gap of about 3.0 eV at room temperature. This was effective to penetrate satisfactorily light emission from the light-emitting layer 104 to the outside.

EFFECTS OF THE INVENTION

As described in the foregoing, in the Group-III nitride semiconductor device of the present invention, a boron phosphide crystal layer is provided between a Group-III nitride semiconductor crystal layer and an ohmic electrode, so as to prevent propagation and penetration of dislocations from the Group-III nitride semiconductor crystal layer. Accordingly, the ohmic electrode having reduced local breakdown and a low contact resistance can be formed, when the ohmic electrode is provided in contact with the boron phosphide crystal layer, and a Group-III nitride semiconductor light-emitting device having excellent voltage breakdown characteristics can be obtained.

While the invention has been described in detail and with reference to specific embodiments thereof, it will be apparent to one skilled in the art that various changes and modifications can be made therein without departing from the spirit and scope thereof.

This application is based on Japanese Patent Application No. P2002-306722 filed Oct. 22, 2002, incorporated herein by reference in its entirety.

What is claimed is:

1. A Group-III nitride semiconductor device comprising a crystal substrate, an electrically conducting Group-III nitride semiconductor ($Al_XGa_YIn_{1-(X+Y)}N$: $0 \leq X<1$, $0<Y \leq 1$ and $0<X+Y \leq 1$) crystal layer vapor-phase grown on the crystal substrate, an ohmic electrode and an electrically conducting boron phosphide crystal layer provided between the ohmic electrode and the Group-III nitride semiconductor crystal layer, said ohmic electrode being disposed in contact with the boron phosphide crystal layer, and said Group-III nitride semiconductor device further comprising an amorphous layer containing boron and phosphorus provided between the Group-III nitride semiconductor crystal layer and the boron phosphide crystal layer.

2. The Group-III nitride semiconductor device as claimed in claim 1, wherein the boron phosphide crystal layer comprises an undoped electrically conducting layer not having an impurity intentionally added thereto, said boron phosphide crystal layer being of the same conduction type as the group-III nitride semiconductor of the group-III nitride semiconductor crystal layer.

3. The Group-III nitride semiconductor device as claimed in claim 1, wherein the boron phosphide crystal layer is provided in a {0.0.0.1.}-crystal face side of the Group-III nitride semiconductor crystal layer and the boron phosphide crystal layer is an electrically conducting {111}-crystal layer.

4. The Group-III nitride semiconductor device as claimed in claim 1, wherein the inside of the boron phosphide crystal layer contains a stacking fault or a twin with the twin plane being a {111}-crystal face along the <111>-crystal azimuth of the boron phosphide crystal layer.

5. The Group-III nitride semiconductor device as claimed in claim 1, wherein a total density of threading dislocations and misfit dislocations inside the boron phosphide crystal layer is $1 \times 10^4/cm^2$ or less.

6. A light-emitting diode comprising the Group-III nitride semiconductor device as claimed in claim 1, said light-emitting diode having a pn-junction double heterojunction structure.

7. A method for producing a Group-III nitride semiconductor device,
said device comprising a crystal substrate, an electrically conducting Group-III nitride semiconductor ($Al_XGa_YIn_{1-(X+Y)}N$: $0 \leq X<1$, $0<Y \leq 1$ and $0<X+Y \leq 1$) crystal layer vapor-phase grown on the crystal substrate, an ohmic electrode and an electrically conducting boron phosphide crystal layer provided between the ohmic electrode and the Group-III nitride semiconductor crystal layer, said ohmic electrode being disposed in contact with the boron phosphide crystal layer, said Group-III nitride semiconductor device further comprising an amorphous layer containing boron and phosphorus provided between the Group-III nitride semiconductor crystal layer and the boron phosphide crystal layer,
said method comprising forming the Group-III nitride semiconductor crystal layer and the boron phosphide crystal layer on the crystal substrate by metal-organic chemical vapor deposition.

8. A light-emitting device comprising a crystal substrate, a lower clad layer comprising an electrically conducting Group-III nitride semiconductor ($Al_XGa_YIn_{1-(X+Y)}N$: $0 \leq X<1$, $0<Y \leq 1$ and $0<X+Y \leq 1$) crystal layer of a first conduction type vapor-phase grown on the crystal substrate, a first ohmic electrode of said first conduction type, an electrically conducting boron phosphide crystal layer of said first conduction type provided between the first ohmic electrode and the lower clad layer, said first ohmic electrode being disposed in contact with a portion of theboron phosphide crystal layer of said first conduction type, a light-emitting layer disposed on a portion of the boron phosphide crystal layer of said first conduction type not occupied by the first ohmic electrode, an upper clad layer comprising a Group-III nitride semiconductor layer of a second conduction type disposed on said light-emitting layer, a second ohmic electrode of said second conduction type, and an electrically conducting boron phosphide crystal layer of said second conduction type provided between the second ohmic electrode and the upper clad layer, said second ohmic electrode being disposed in contact with the boron phosphide crystal layer of said second conduction type, and said light-emitting device further comprising an amorphous layer containing boron and phosphorus provided between at least one of (i) the lower clad layer and the boron phosphide crystal layer of said first conduction type and (ii) the upper clad layer and the boron phosphide crystal layer of said second conduction type.

9. A light-emitting device comprising a crystal substrate, a lower clad layer comprising an electrically conducting Group-III nitride semiconductor ($Al_XGa_YIn_{1-(X+Y)}N$: $0 \leq X<1$, $0<Y \leq 1$ and $0<X+Y \leq 1$) crystal layer of a first conduction type vapor-phase grown on the crystal substrate, a first ohmic electrode of said.first conduction type, an electrically conducting boron phosphide crystal layer of said first conduction type provided between the first ohmic electrode and the lower clad layer, said first ohmic electrode being disposed in contact with a portion of the boron phosphide crystal layer of said first conduction type, a light-emitting layer disposed on a portion of the boron phosphide crystal layer of said first conduction type not occupied by the first ohmic electrode, an upper clad layer comprising a Group-III nitride semiconductor layer of a second conduction type disposed on said light-emitting layer, and a second ohmic electrode of said second conduction type disposed on said upper clad layer via an upper boron phosphide layer of said second conduction type and a lower boron phosphide layer of said first conduction type, wherein both upper and lower boron phosphide layers contact said upper clad layer.

10. The light-emitting device as claimed in claim 9, wherein said upper and lower boron phosphide layers form a pn junction.

11. The light-emitting device as claimed in claim 9, further comprising an amorphous layer containing boron and phosphorus provided between the lower clad layer and the boron phosphide crystal layer of said first conduction type.

* * * * *